US 9,417,999 B2

(12) United States Patent
Benhase et al.

(10) Patent No.: US 9,417,999 B2
(45) Date of Patent: Aug. 16, 2016

(54) WRITE PEFORMANCE IN SOLID STATE STORAGE BY RECOGNIZING COPY SOURCE TO TARGET OPERATIONS AND ONLY STORING UPDATES INSTEAD OF ENTIRE BLOCK

(71) Applicant: International Business Machines Corporation, Armonk, NY (US)

(72) Inventors: Michael T. Benhase, Tucson, AZ (US); Andrew D. Walls, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 181 days.

(21) Appl. No.: 13/716,628

(22) Filed: Dec. 17, 2012

(65) Prior Publication Data

US 2014/0173177 A1 Jun. 19, 2014

(51) Int. Cl.
*G06F 12/02* (2006.01)
*G06F 11/14* (2006.01)

(52) U.S. Cl.
CPC ............ *G06F 12/0246* (2013.01); *G06F 11/14* (2013.01); *G06F 11/1471* (2013.01)

(58) Field of Classification Search
CPC .............................. G06F 3/061; G06F 12/0246
See application file for complete search history.

(56) References Cited

U.S. PATENT DOCUMENTS

| | | | |
|---|---|---|---|
| 5,490,260 A | 2/1996 | Miller et al. | |
| 5,586,285 A | 12/1996 | Hasbun et al. | |
| 5,802,553 A | 9/1998 | Robinson et al. | |
| 6,145,069 A | 11/2000 | Dye | |
| 6,282,671 B1 | 8/2001 | Islam et al. | |
| 6,928,521 B1 | 8/2005 | Burton et al. | |
| 7,418,645 B2 | 8/2008 | Srivastava | |
| 7,584,336 B2 | 9/2009 | Tremaine | |
| 7,596,657 B2 | 9/2009 | Kaler | |
| 7,873,619 B1 | 1/2011 | Faibish et al. | |
| 8,117,587 B1* | 2/2012 | Testardi | 717/100 |
| 2002/0169740 A1* | 11/2002 | Korn | 707/1 |
| 2009/0006399 A1* | 1/2009 | Raman et al. | 707/7 |
| 2009/0043826 A1 | 2/2009 | Butterworth et al. | |
| 2010/0070661 A1* | 3/2010 | Cherry et al. | 710/19 |
| 2010/0281208 A1 | 11/2010 | Yang | |
| 2011/0066808 A1* | 3/2011 | Flynn | G06F 12/0246 711/118 |
| 2011/0161559 A1 | 6/2011 | Yurzola et al. | |

(Continued)

OTHER PUBLICATIONS

Guanying Wu and Xubin He. 2012. Delta-FTL: improving SSD lifetime via exploiting content locality. In Proceedings of the 7th ACM european conference on Computer Systems (EuroSys '12). ACM, New York, NY, USA, 253-266. DOI=10.1145/2168836.2168862 http://doi.acm.org/10.1145/2168836.2168862.*

(Continued)

*Primary Examiner* — Reginald Bragdon
*Assistant Examiner* — Edward Wang
(74) *Attorney, Agent, or Firm* — Stephen R. Tkacs; Stephen J. Walder, Jr.; Randall J. Bluestone

(57) ABSTRACT

A mechanism is provided in a data processing system for accessing a solid state drive. Responsive to receiving request to write an update to a block of data in the solid state drive with an update option set, the mechanism reads the block of data from the solid state drive. The mechanism determines a difference between the update and the block of data. The mechanism compresses the difference to form an update record. The mechanism stores the update record and modifies metadata of the block of data to reference the update record.

13 Claims, 4 Drawing Sheets

(56) References Cited

U.S. PATENT DOCUMENTS

| | | | |
|---|---|---|---|
| 2011/0191528 A1* | 8/2011 | Suzuki | G06F 12/02 711/103 |
| 2012/0137059 A1* | 5/2012 | Yang et al. | 711/104 |

OTHER PUBLICATIONS

PCT Notification of Transmittal of the International Search Report and the Written Opinion of the International Searching Authority, or the Declaration (PCT/ISA/220), the International Search Report (PCT/ISA/210) and the Written Opinion of the International Searching Authority (PCT/ISA/237), International Application PCT/US2013/074228 dated Apr. 28, 2014, 11 pages.

Cieslicki, Damian et al., "Efficient Updates in Highly Avaiiabie Distributed Random Access Memory", Proceedings of the 12th International Conference on Parallel and Distributed Systems (ICPADS'06), Jul. 12, 2006, vol. 1, pp. 49-57.

* cited by examiner

WRITE PEFORMANCE IN SOLID STATE STORAGE BY RECOGNIZING COPY SOURCE TO TARGET OPERATIONS AND ONLY STORING UPDATES INSTEAD OF ENTIRE BLOCK

BACKGROUND

The present application relates generally to an improved data processing apparatus and method and more specifically to mechanisms for improving write performance in solid state storage by recognizing copy source to target operations and only storing updates instead of entire blocks.

A solid-state drive (SSD) is a data storage device that uses solid-state memory to store persistent data with the intention of providing access in the same manner of a traditional block I/O hard disk drive. SSDs are distinguished from traditional hard disk drives (HDDs), which are electromechanical devices containing spinning disks and movable read/write heads. SSDs, in contrast, use microchips which retain data in non-volatile memory chips and contain no moving parts. Compared to electromechanical HDDs, SSDs are typically less susceptible to physical shock, are quieter, and have lower access time and latency. SSDs use the same interface as hard disk drives, thus easily replacing them in most applications.

SSDs are starting to revolutionize the data center as heretofore unheard of levels of performance are now possible. Servers can bring in more data, and the input/output (IO) bottleneck is not as large it once was. Storage systems are also starting to use SSDs as tiers of storage alongside HDDs. In some cases, pure SSD configurations are starting to be used. Because SSDs hold vital client data, it is important that the drives still have some sort of disaster recovery solution applied to them like flash copy or peer-to-peer remote copy or both.

SUMMARY

In one illustrative embodiment, a method, in a data processing system, is provided for accessing a solid state drive. The method comprises responsive to receiving request to write an update to a block of data in the solid state drive with an update option set, reading the block of data from the solid state drive. The method further comprises determining a difference between the update and the block of data. The method further comprises compressing the difference to form an update record. The method further comprises storing the update record and modifying metadata of the block of data to reference the update record.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Figure 1:
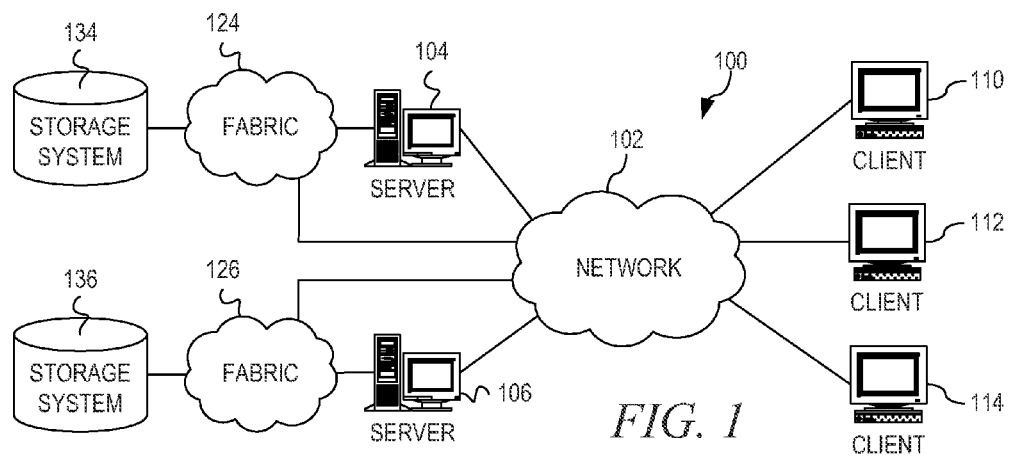
FIG. 1 depicts a pictorial representation of an example distributed data processing system in which aspects of the illustrative embodiments may be implemented.
Figure 2:
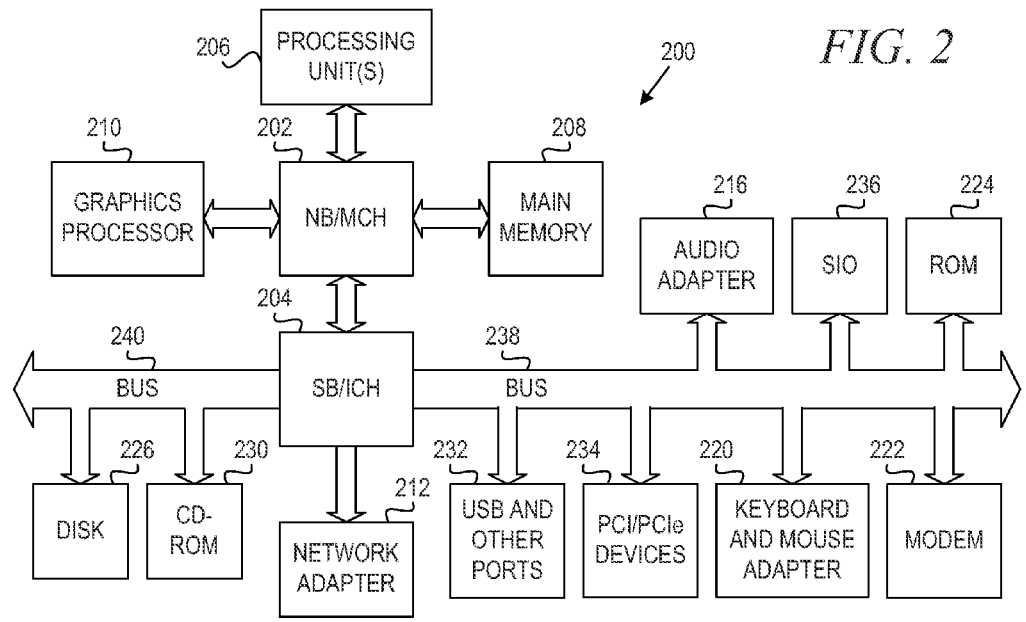
FIG. 2 is a block diagram of an example data processing system in which aspects of the illustrative embodiments may be implemented.
Figure 3:
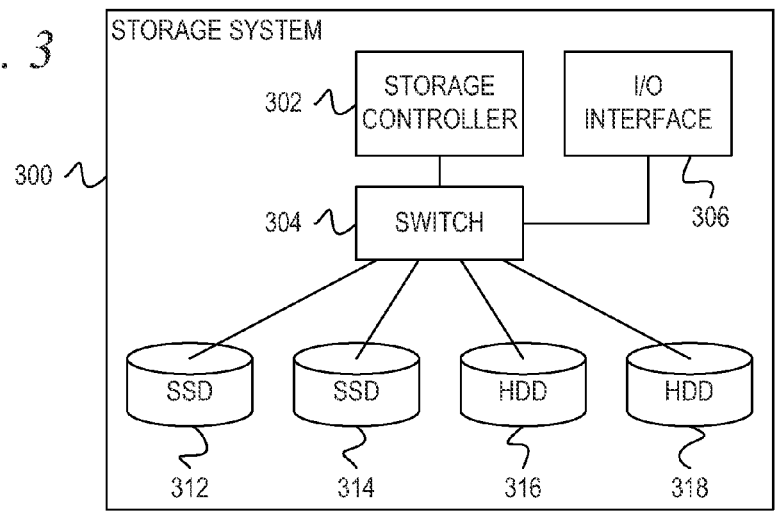
FIG. 3 is a block diagram depicting an example storage system in accordance with an illustrative embodiment.

The illustrative embodiments may be utilized in many different types of data processing environments including a distributed data processing environment, a single data processing device, or the like. In order to provide a context for the description of the specific elements and functionality of the illustrative embodiments, FIGS. 1-3 are provided hereafter as example environments in which aspects of the illustrative embodiments may be implemented. While the description following FIGS. 1-3 will focus primarily on a single data processing device implementation, this is only an example and is not intended to state or imply any limitation with regard to the features of the present invention.

With reference now to the figures and in particular with reference to FIGS. 1-3, example diagrams of data processing environments are provided in which illustrative embodiments of the present invention may be implemented. It should be appreciated that FIGS. 1-3 are only examples and are not intended to assert or imply any limitation with regard to the environments in which aspects or embodiments of the present invention may be implemented. Many modifications to the depicted environments may be made without departing from the spirit and scope of the present invention.

FIG. 1 depicts a pictorial representation of an example distributed data processing system in which aspects of the illustrative embodiments may be implemented. Distributed data processing system 100 may include a network of computers, communication fabrics, and storage systems in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102. Server 104 is also connected to storage system 134 via fabric 124, and server 106 is connected to storage system 136 via fabric 126. In addition, clients 110, 112, and 114 are also connected to network 102. These clients 110, 112, and 114 may be, for example, personal computers, network computers, or the like. In the depicted example, server 104 may provide data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

Fabrics 124, 126 may be any communications fabric that supports I/O traffic between a host and a storage system. For example, fabrics 124, 126 may be Fibre Channel, serial attached SCSI, Ethernet, or the like, and may include switches or routers to support I/O communication. Fabrics 124, 126 may also support connection to network 102. For example, server 106 may access storage system 134 via network 102 and fabric 124 without intervention of server 104. Similarly, server 104 may access storage system 136 without intervention of server 106.

In accordance with an illustrative embodiment, distributed data processing system 100 provides a dual remote copy configuration for disaster recovery. That is, when server 104 performs a write operation to storage system 134, the write operation is also performed at storage system 136. The dual remote copy may be performed by the host, such as server 104, or by the storage system itself, such as storage system 134. For example, server 104 may write data to storage system 134 and have the data copied to storage system 136 such that if storage system 134 were to fail, server 104 may then read the data from storage system 136.

Storage system 136 may be placed at a remote location from storage system 134, perhaps on a different continent. Thus, if there was a disaster, such as a fire or the like, and storage system 134 was destroyed, the data would be safe at storage system 136, and storage system 134 could be recreated using the data at storage system 136.

Storage systems 134, 136 may use solid-state drives (SSDs), either alone or alongside hard disk drives (HDDs), in a tiered storage configuration. A very common storage operation involves doing point-in-time copies to ensure data is not lost due to an unexpected event like a catastrophic equipment failure, software bug, or natural disaster. Such copies involve doing a background copy of all the data in the volume, logical unit (LUN), dataset, or data from the source to the target.

Additionally, any update to the source while the copy is being done but before it could be copied via background copy would result in a certain part of the data being updated with the host write and then being copied over to the target. The minimum update size of the data is a function of how much metadata the system can handle. For example, the system may be broken into 64K "tracks" or 56K "tracks." If the host updates a 4K "page" inside the 64K track, then the copy source to target function will read 64K off the source, update 4K, and then write the 64K to the target. In such a scenario, very little of the data actually changed.

For hard disk drives (HDDs), there is no problem with copy source to target operations, because HDDs can do unlimited writes. However, with solid state drives (SSDs), write performance is limited, as is write endurance. If the target already existed above and only 4K changed, then that means an additional 60K are written needlessly. This is a write amplification of 16. In addition, because the write cache is relatively small on an SSD, a large portion would be taken up by data that already exists.

There are SSDs today that compress data coming in, but that usually gives only a 2× to 3× reduction. That would reduce the write amplification to 5× to 8× if the data is compressible.

In accordance with the illustrative embodiments, a mechanism is provided to perform flash copy functions that write a certain size block over to the target whenever the source has an update to even a small part of the block. The mechanism keeps metadata on what has changed manageable. Therefore, only a small part of the block changes. The mechanism of the illustrative embodiments has the SSD perform a read to the old block, do an XOR compare, and compress the result, which has the effect of extracting the delta. The mechanism of the illustrative embodiments stores these differences and eventually merges them, for example during a garbage collection operation.

FIG. 2 is a block diagram of an example data processing system in which aspects of the illustrative embodiments may be implemented. Data processing system 200 is an example of a computer, such as client 110 or server 104 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 200 (Java is a trademark of Sun Microsystems, Inc. in the United States, other countries, or both).

As a server, data processing system 200 may be, for example, an IBM® eServer™ System p® computer system, running the Advanced interactive Executive (AIX®) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

FIG. 3 is a block diagram depicting an example storage system in accordance with an illustrative embodiment. Storage enclosure 300, which may be storage system 134 or storage system 136 in FIG. 1, for example, is comprised of storage controller 302, which may be a redundant array of independent disks (RAID) controller or a non-RAID controller. Storage controller 302 communicates storage devices 312, 314, 316, and 318 through switch 304. Switch 304 may be, for example, a serial attached SCSI (SAS) switch. Other devices in a storage area network (SAN) may write data to or read data from storage enclosure 300 by connection to switch 304 via I/O interface 306. Storage controller 302 may be a processor operating under control of instructions stored in a memory (not shown).

In the depicted example, storage devices 312, 314, 316, and 318 include solid-state drives (SSDs) 312, 314 and hard disk drives (HDDs) 316, 318. SSDs 312, 314 may be used alongside HDDs 316, 318 in a tiered storage configuration.

Those of ordinary skill in the art will appreciate that the hardware in FIGS. 1-3 may vary depending on the implementation. Other internal hardware or peripheral devices, such as flash memory, equivalent non-volatile memory, or optical disk drives and the like, may be used in addition to or in place of the hardware depicted in FIGS. 1-3. Also, the processes of the illustrative embodiments may be applied to a multiprocessor data processing system, other than the SMP system mentioned previously, without departing from the spirit an scope of the present invention.

Figure 4:
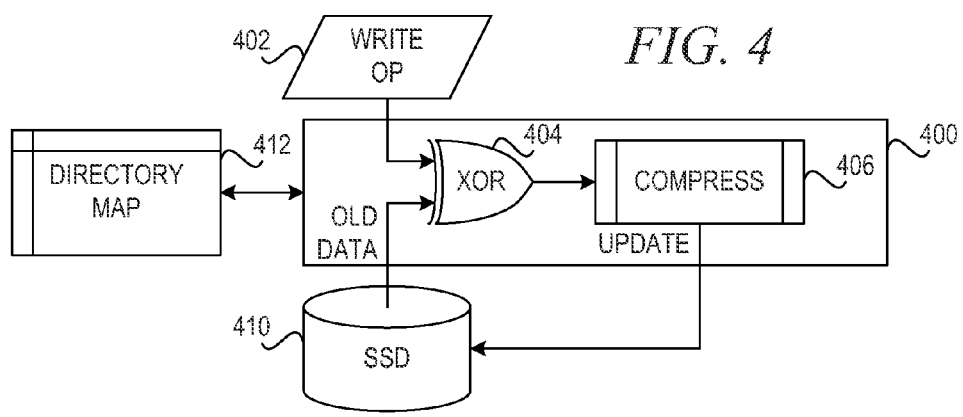
FIG. 4 is a block diagram illustrating the operation of performing a write to a storage device in accordance with an illustrative embodiment.

FIG. 4 is a block diagram illustrating the operation of performing a write to a storage device in accordance with an illustrative embodiment. The illustrative embodiments may provide anew small computer system interface (SCSI) command, a new bit in the SCSI command block, an option to simply do the new function on logical block address (LBA) ranges or write commands, which are greater than a certain size, such as 56K. When a storage device, such as a solid state drive (SSD), detects a write with the option set as above then it will read the previous LBA range, if it exists, and then XOR the old data with the data written by the host.

The processor 400 of the storage controller or solid state drive receives a write operation 402 from an initiator, e.g., a host. If the write operation 402 has the update option set and the LBA range exists in SSD storage 410, processor 400 reads the old data from SSD storage 410 and performs an XOR operation 404 on the write data from the write operation 402 and the old data from SSD storage 410. Processor 400 performs a compress operation 406 on the result of the XOR operation 404 to generate an update record. The compression operation 406 may use a known compression algorithm, such as the GNU Project's GNUP Zip (GZIP), LZI, etc. Processor 400 then stores the update record in SSD storage 410.

The illustrative embodiment enhances the directory map 412 for the data element in the SSD 410 to signify that one or more update elements exist. A new form of invalidation is described. Normally, a chunk in an SSD is invalidated when an update write occurs and the update is then written somewhere else and the directory map 412 is changed. In this case, the data element is augmented with one or more update records that must be merged with the old data to form the new data. The directory map 412 describes where the update records are stored. Update records may be stored in the SSD or in memory. The directory map may be stored in the SSD or memory.

While there is in theory no limit to how many update records can exist, in practice, reads to flash are not trivial. Therefore, the system may limit the number of update records for an LBA range to a predetermined number, such as one or two or three. In this way, once processor 400 does the $(n+1)^{th}$ update, the processor may merge the old data with all existing update records and write the entire data element to SSD storage 410 while invalidating the old data and the update records. Processor 400 may then update directory map 412 to point to the new data element.

The illustrative embodiments may provide a mechanism for a new type of garbage collection. The number of update records may begin to grow. The mechanism may determine whether the total number of update records exceeds a predetermined threshold. In response to the number of update records exceeding the threshold, the mechanism may perform merges of certain records in order to reclaim space. For example, the mechanism may merge the oldest update records. Alternatively, the mechanism may select update records for the most frequently used LBA ranges to be merged to reclaim space. Other criteria for selecting update records to merge may be used depending upon the implementation.

Figure 5:
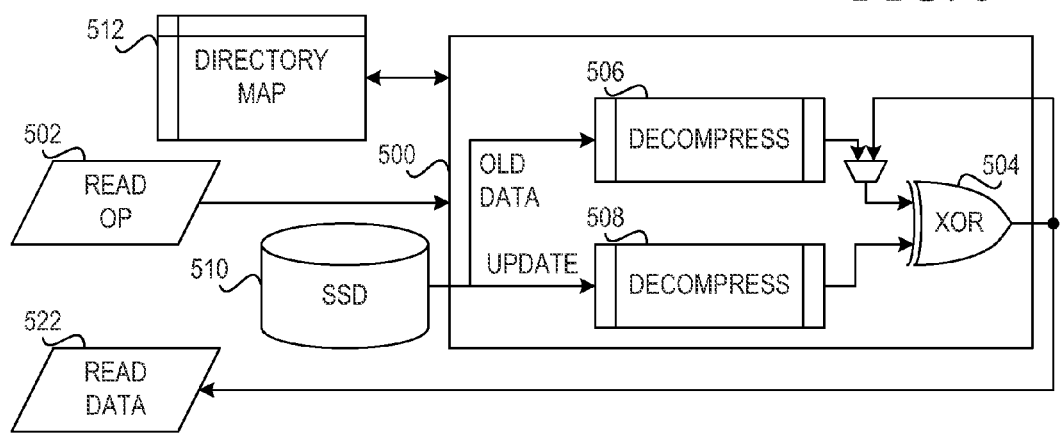
FIG. 5 is a block diagram illustrating the operation of performing a read from a storage device in accordance with an illustrative embodiment.

FIG. 5 is a block diagram illustrating the operation of performing a read from a storage device in accordance with an illustrative embodiment. The processor 500 of the storage controller or solid state drive receives a read operation 502 from an initiator, e.g., a host. The processor looks up the LBA range of the read operation in directory map 512, which points to where the data element is stored in SSD storage 510 and identifies whether update records exist for the data element. Processor 500 reads the old data and a first update record from SSD storage 510. Processor 500 performs decompression operation 506 on the old data, if the old data is compressed, and performs decompression operation 508 on the update record. Processor 500 performs XOR operation 504 on the decompressed old data and the decompressed update record. If the update record is not the last update record for the data element, processor 500 reads the next update record from SSD storage 510, performs decompression operation 508 on the update record, and performs XOR operation 504 on the previous result and the decompressed update record. If there are no more update records, processor 500 returns the result of XOR operation 504 to the initiator as read data 522.

The read operation of the illustrative embodiment can increase the latency of reads. However, flash copy operations are rarely read. The penalty to do the merge is small compared to the increased performance of writes.

The embodiments of the illustrative embodiments may be used on background copies if the amount of data updated is relatively small. In fact, the processor may use a threshold to determine whether the size of the update is greater than a predetermined percentage of the original data. If the size of the update is greater than the predetermined percentage, the processor may invalidate the original and write the new data. If the size of the update is less than the predetermined percentage, the processor may create an update record.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 6:
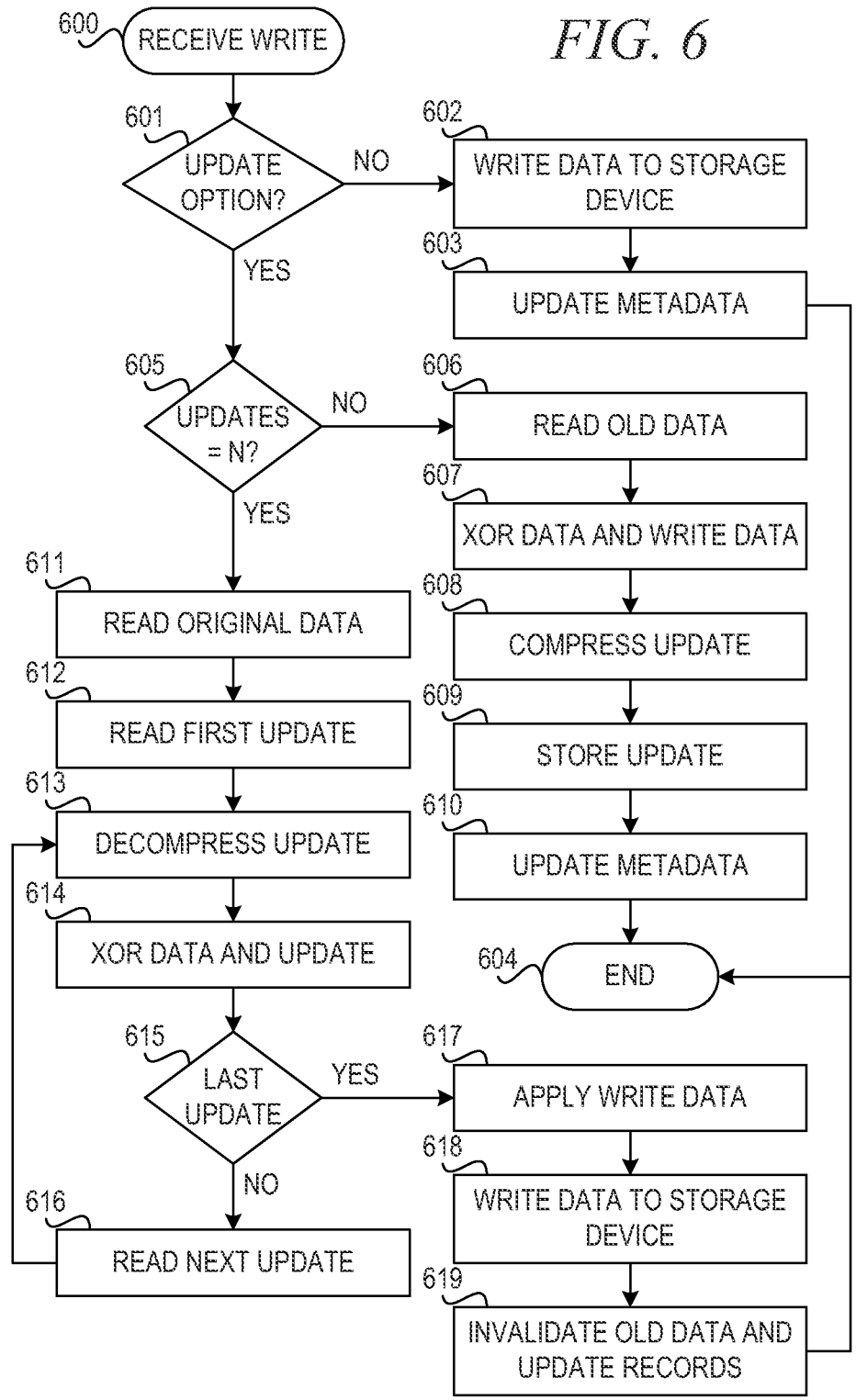
FIG. 6 is a flowchart illustrating operation of a mechanism for performing a write to a storage device in accordance with an illustrative embodiment.

FIG. 6 is a flowchart illustrating operation of a mechanism for performing a write to a storage device in accordance with an illustrative embodiment. Operation begins when the mechanism receives a write operation from an initiator (block 600). The mechanism then determines whether the write operation has an update operation set (block 601). The mechanism may determine the write operation has an update operation set if a bit in the SCB is set or the write operation is a specialized command indicating the write is a small update to a block of data. Alternatively, the mechanism may determine the write operation has an update operation set by comparing an amount of data being updated to the original data element.

If the mechanism determines the write operation does not have an update option set, the mechanism writes the data to the storage device (block 602) and updates the metadata to invalidate the old data, if any, and indicate that no update record exists (bock 603). Thereafter, operation ends (block 604).

If the mechanism determines the write operation has an update option set block 601, the mechanism determines whether the number of updates to the data element is equal to a predetermined threshold, N (block 605). If the number of update records is not equal to N, the mechanism reads the old data (block 606), performs an XOR operation on the old data and the write data (block 607), compresses the result to form an update record (block 608), and stores the update record (block 609). The mechanism then updates the metadata to indicate the existence of the update record (block 610), and operation ends (block 604). If one or more update records already exist for the data element, the mechanism may read the old data in block 606 and merge the existing update records prior to generating the update record for the current write data.

If the number of updates is equal to N block 605, the mechanism reads the original data (block 611), reads a first update record (block 612), decompresses the first update (block 613), and performs an XOR operation on the original data and the update (block 614). The mechanism then determines whether the update is the last update record stored for the data element (block 615). If the update is the not the last update record for the data element, the mechanism reads the next update record (block 616), and operation returns to block 613 to decompress the update record and perform an XOR operation on the previous result and the update (block 614). The process repeats until the update is the last previously stored update record for the data element in block 615.

If the update is the last previously stored update record for the data element in block 615, then the mechanism has generated the old data for the current write operation. The mechanism then applies the current write data to the data element (block 617), writes the data to the storage device (block 618), and updates the metadata to invalidate the old data and the previous update records and to indicate there are no update records (block 619). Thereafter, operation ends (block 604).

Figure 7:
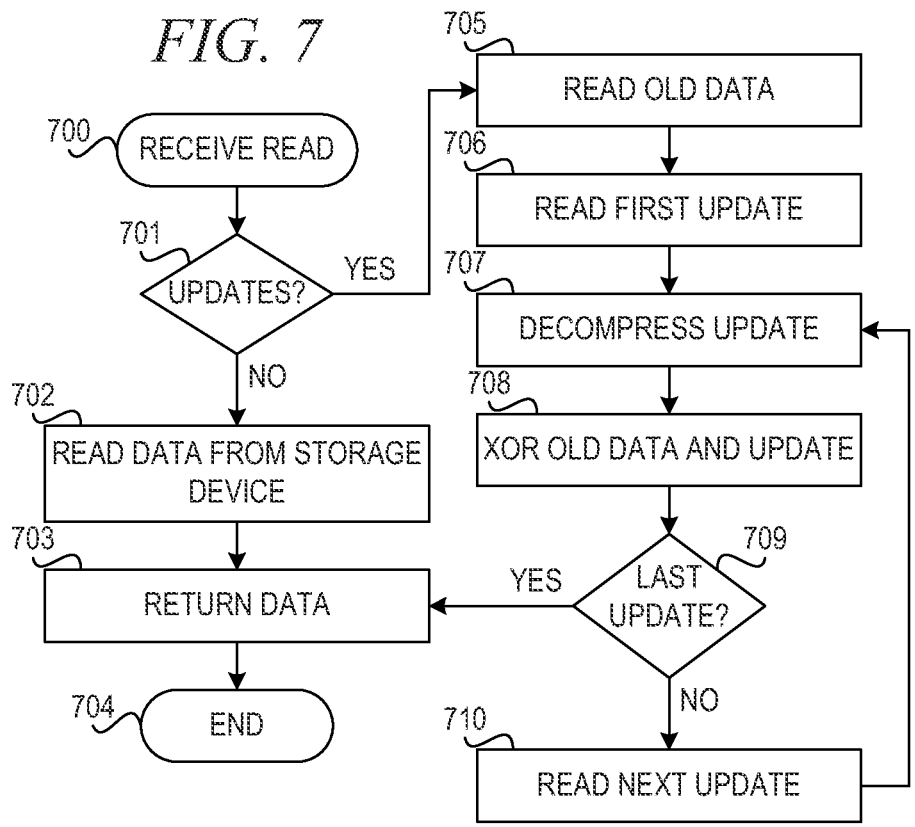
FIG. 7 is a flowchart illustrating operation of a mechanism for performing a write to a storage device in accordance with an illustrative embodiment.

FIG. 7 is a flowchart illustrating operation of a mechanism for performing a write to a storage device in accordance with an illustrative embodiment. Operation begins when the mechanism receives a read operation from an initiator (block 700), and the mechanism determines whether updates exist for the data element being read (block 701). If there are no update records for the data element, the mechanism reads the requested data from the storage device (block 702) and returns the data to the initiator (block 703). Thereafter, operation ends.

If there are update records for the data element in block 701, the mechanism reads the old data (block 705), reads the first update record (block 706), decompresses the update (block 707), and performs an XOR operation on the old data and the update record (block 708). The mechanism then determines whether the update is the last update record for the data element (block 709). If the update is not the last update, the mechanism reads the next update record (block 710), and operation returns to block 707 to decompress the update record and perform an XOR operation on the (previous result and the decompressed update data (block 708). If the update is the last update stored for the data element in block 709, the mechanism returns the result as read data (block 703), and operation ends (block 704).

Figure 8:
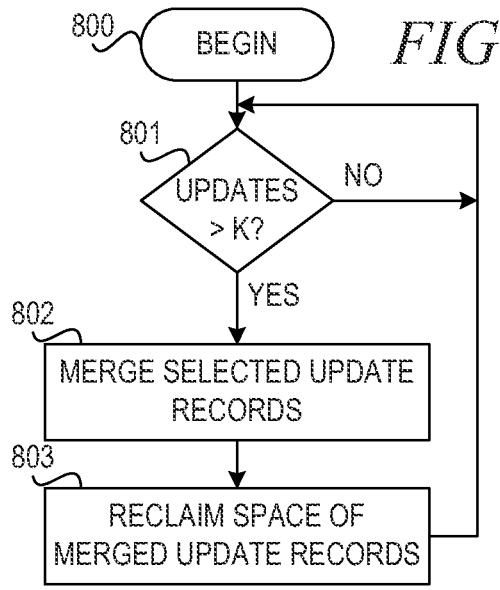
FIG. 8 is a flowchart illustrating operation of a mechanism for performing garbage collection of a storage device in accordance with an illustrative embodiment.

FIG. 8 is a flowchart illustrating operation of a mechanism for performing garbage collection of a storage device in accordance with an illustrative embodiment. Operation begins in block 800, and the mechanism determines whether the number of update records exceeds a threshold, K (block 801). The threshold may be a predetermined number of update records, a predetermined amount of storage, or a predetermined percentage of storage, for example. If the number of update records does not exceed the threshold, operation returns to block 801 until the number of update records does exceed the threshold.

If the number of update records exceeds the threshold, K, in block 801, the mechanism merges selected update records (block 802) and reclaims the space of the merged update records (block 803). Thereafter, operation returns to block 801 to determine whether the number of update records exceeds the threshold. The mechanism may select update records to merge based on the oldest update records, the least frequently used data elements, or another scheme for identifying update records as candidates for garbage collection. The mechanism may merge the selected update records by reading the data elements as described above with reference to FIG. 7, writing the resulting data element, and invalidating the old data element and update records. The mechanism may then reclaim the space taken by invalid data elements and update records.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, the illustrative embodiments provide mechanisms for performing flash copy functions that write a certain size block over to the target whenever the source has an update to even a small part of the block. The mechanism performs a read of the old block, does an XOR compare, and compresses the result, which has the effect of extracting the delta. The mechanism then stores these differences and eventually merges them, for example during a garbage collection operation.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer program product comprising a non-transitory computer readable medium having a computer readable program stored therein, wherein the computer readable program, when executed on a computing device, causes the computing device to:
    responsive to receiving a request to write an update to a block of data in a solid state storage with an update option set, read the block of data from the solid state storage;
    determine a difference between the update and the block of data;
    compress the difference to form an update record;
    store the update record;
    modify metadata of the block of data to reference the update record;
    determine whether an amount of storage space of a total number of updates to the entire solid state storage exceeds a predetermined percentage of storage in the solid state storage; and
    responsive to determining that the amount of storage space of the total number of updates to the entire solid state storage exceeds the predetermined percentage of storage in the solid state storage, initiate a garbage collection operation on the solid state storage, wherein the garbage collection operation comprises:
        selecting a plurality of blocks of data in the solid state storage for garbage collection, wherein the plurality of blocks of data are the least recently used blocks of data in the solid state storage;
        merging update records with the plurality of blocks of data in the solid state storage to form a plurality of merged blocks of data;
        invalidating the update records and the plurality of blocks of data;
        reclaiming storage space of the update records and the plurality of blocks of data; and
        writing the plurality of merged blocks of data to the solid state storage.

2. The computer program product of claim 1, wherein determining the difference between the update and the block of data comprises performing an XOR operation on the update and the block of data read from the solid state drive.

3. The computer program product of claim 1, wherein modifying the metadata of the block of data to reference the update record comprises invalidating the block of data in the solid state drive.

4. The computer program product of claim 1, wherein the computer readable program further causes the computing device to:
    responsive to receiving a request to read the block of data in the solid state drive with an update option set, read the block of data from the solid state drive;
    merge the update record with the block of data to form an updated block of data; and
    return the updated block of data.

5. The computer program product of claim 1, wherein the computer readable program is stored in a computer readable storage medium in a data processing system and wherein the computer readable program was downloaded over a network from a remote data processing system.

6. The computer program product of claim 1, wherein the computer readable program is stored in a computer readable storage medium in a server data processing system and wherein the computer readable program is downloaded over a network to a remote data processing system for use in a computer readable storage medium with the remote system.

7. An apparatus, comprising:
    a processor, and
    a memory coupled to the processor, wherein the memory comprises instructions which, when executed by the processor, cause the processor to:
        responsive to receiving a request to write an update to a block of data in a solid state storage with an update option set, read the block of data from the solid state storage;
        determine a difference between the update and the block of data;
        compress the difference to form an update record;
        store the update record;
        modify metadata of the block of data to reference the update record;
        determine whether an amount of storage space of a total number of updates to the entire solid state storage exceeds a predetermined percentage of storage in the solid state stone; and
        responsive to determining that the amount of storage space of total number of updates to the entire solid state storage exceeds the predetermined percentage of storage in the solid state storage, initiate a garbage collection operation on the solid state storage, wherein the garbage collection operation comprises:
            selecting a plurality of blocks of data in the solid state storage for garbage collection, wherein the plurality of blocks of data are the least recently used blocks of data in the solid state storage;
            merging update records with the plurality of blocks of data in the solid state storage to form a plurality of merged blocks of data;

invalidating the update records and the plurality of blocks of data;

reclaiming storage space of the update records and the plurality of blocks of data; and writing the plurality of merged blocks of data to the solid state storage.

8. The apparatus of claim 7, wherein determining the difference between the update and the block of data comprises performing an XOR operation on the update and the block of data read from the solid state drive.

9. The apparatus of claim 7, wherein the instructions further cause the processor to:

responsive to receiving a request to read the block of data in the solid state drive with an update option set, read the block of data from the solid state drive;

merge the update record with the block of data to form an updated block of data; and return the updated block of data.

10. A method, in a data processing system, for accessing a solid state drive, the method comprising:

responsive to a receiving request to write an update to a block of data in the solid state storage with an update option set, reading the block of data from the solid state storage;

determining a difference between the update and the block of data;

compressing the difference to form an update record;

storing the update record;

modifying metadata of the block of data to reference the update record;

determining whether an amount of storage space of a total number of updates to the entire solid state storage exceeds a predetermined percentage of storage in the solid state storage; and responsive to determining that the amount of storage space of the total number of updates to the entire solid state storage exceeds the predetermined percentage of storage in the solid state storage, initiating a garbage collection operation on the solid state storage, wherein the garbage collection operation comprises:

selecting a plurality of blocks of data in the solid state storage for garbage collection, wherein the plurality of blocks of data are the least recently used blocks of data in the solid state storage;

merging update records with the plurality of blocks of data in the solid state storage to form a plurality of merged blocks of data;

invalidating the update records and the plurality of blocks of data;

reclaiming storage space of the update records and the plurality of blocks of data; and writing the plurality of merged blocks of data to the solid state storage.

11. The method of claim 10, wherein determining the difference between the update and the block of data comprises performing an XOR operation on the update and the block of data read from the solid state drive.

12. The method of claim 10, further comprising:

responsive to receiving a request to read the block of data in the solid state drive with an update option set, reading the block of data from the solid state drive;

merging the update record with the block of data to form an updated block of data; and returning the updated block of data.

13. The method of claim 10, wherein modifying the metadata of the block of data to reference the update record comprises invalidating the block of data in the solid state drive.

* * * * *